(12) United States Patent
Zou

(10) Patent No.: US 9,015,642 B2
(45) Date of Patent: Apr. 21, 2015

(54) HYBRID METHOD FOR PERFORMING FULL FIELD OPTICAL PROXIMITY CORRECTION FOR FINFET MANDREL LAYER

(71) Applicant: Yi Zou, Foster City, CA (US)

(72) Inventor: Yi Zou, Foster City, CA (US)

(73) Assignee: Globalfoundries Inc., Grand Cayman (KY)

( * ) Notice: Subject to any disclaimer, the term of this patent is extended or adjusted under 35 U.S.C. 154(b) by 0 days.

(21) Appl. No.: 13/803,293

(22) Filed: Mar. 14, 2013

(65) Prior Publication Data

US 2014/0282296 A1 Sep. 18, 2014

(51) Int. Cl.
*G06F 17/50* (2006.01)
*H01L 21/027* (2006.01)

(52) U.S. Cl.
CPC .................... *H01L 21/027* (2013.01)

(58) Field of Classification Search
CPC .................... G06F 17/30; G06F 17/50
USPC .......................................... 716/53
See application file for complete search history.

(56) References Cited

U.S. PATENT DOCUMENTS

| | | | |
|---|---|---|---|
| 2006/0085772 A1* | 4/2006 | Zhang | 716/4 |
| 2010/0064273 A1* | 3/2010 | Credendino et al. | 716/19 |
| 2012/0280331 A1* | 11/2012 | Ou et al. | 257/401 |
| 2013/0134513 A1* | 5/2013 | Standaert et al. | 257/347 |
| 2013/0207199 A1* | 8/2013 | Becker et al. | 257/369 |

\* cited by examiner

*Primary Examiner* — Vuthe Siek
*Assistant Examiner* — Mohammed Alam
(74) *Attorney, Agent, or Firm* — Ditthavong & Steiner, P.C.

(57) ABSTRACT

A hybrid OPC process and a resulting reticle are disclosed. Embodiments include generating a finfet fin reticle including a first portion having regular pitches and a second portion having irregular pitches, performing rule based OPC on at least the first portion, and performing OPC repair locally at the second portion.

13 Claims, 14 Drawing Sheets

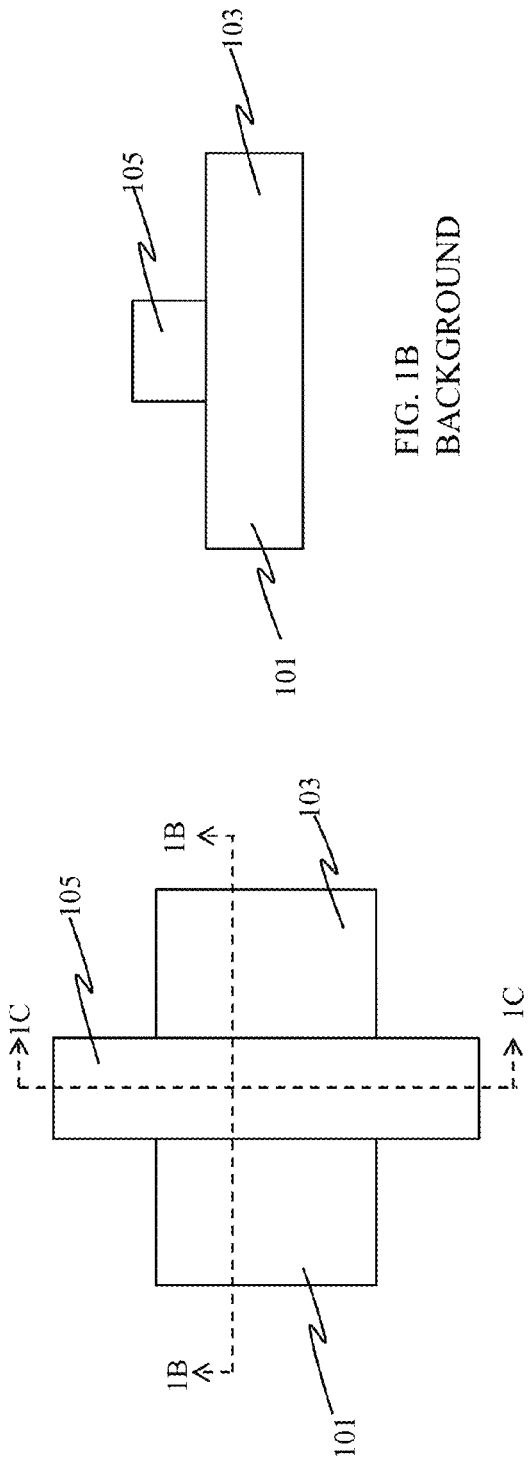
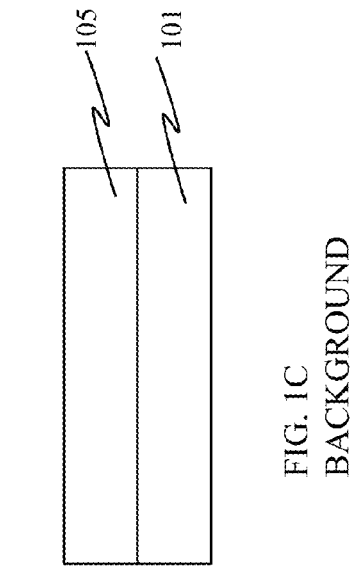
FIG. 1B
BACKGROUND
FIG. 1C
BACKGROUND
FIG. 1A
BACKGROUND

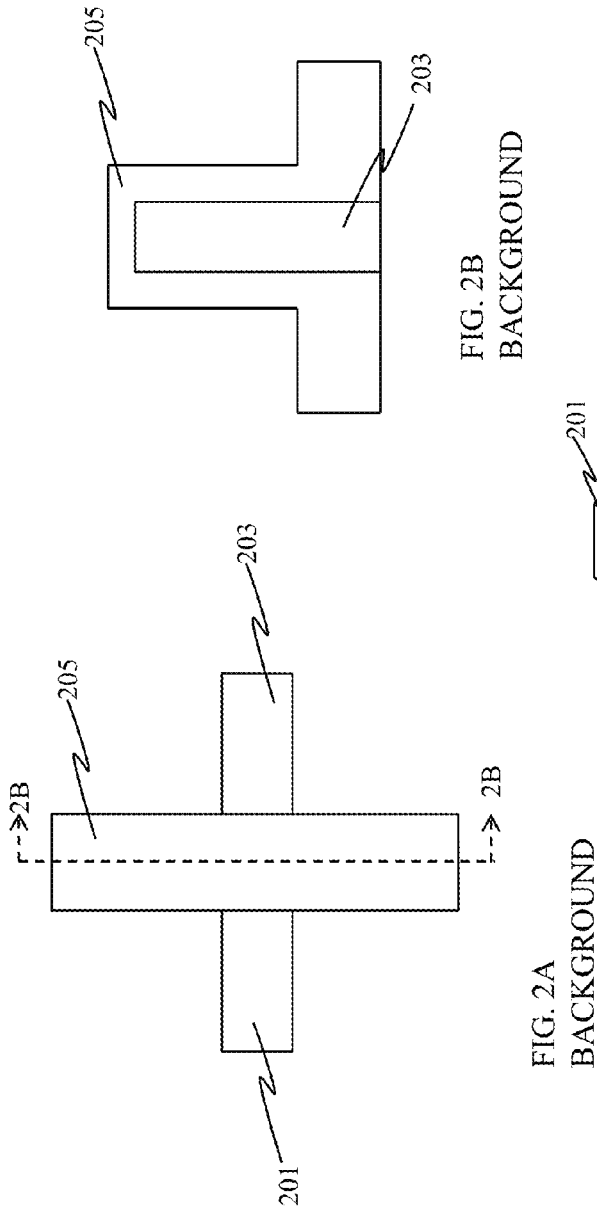
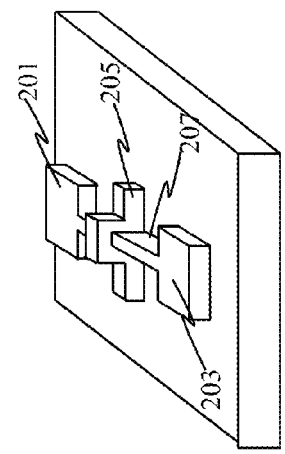
FIG. 2A BACKGROUND
FIG. 2B BACKGROUND
FIG. 2C BACKGROUND

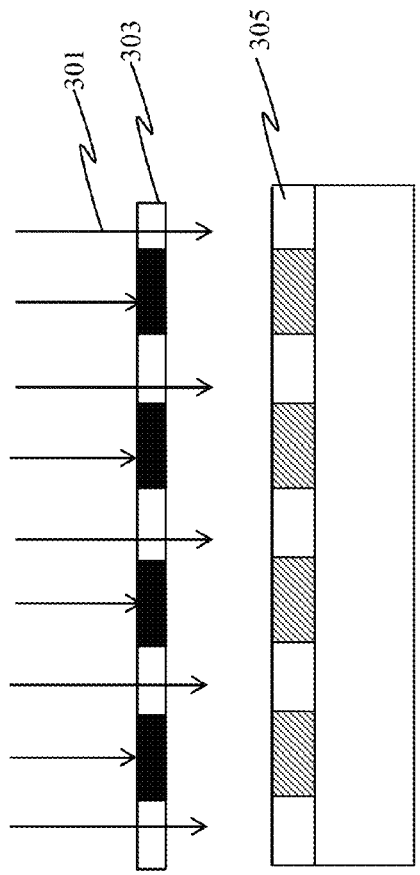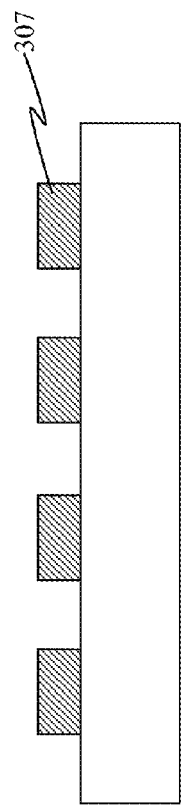
FIG. 3A
BACKGROUND
FIG. 3B
BACKGROUND

BACKGROUND

BACKGROUND

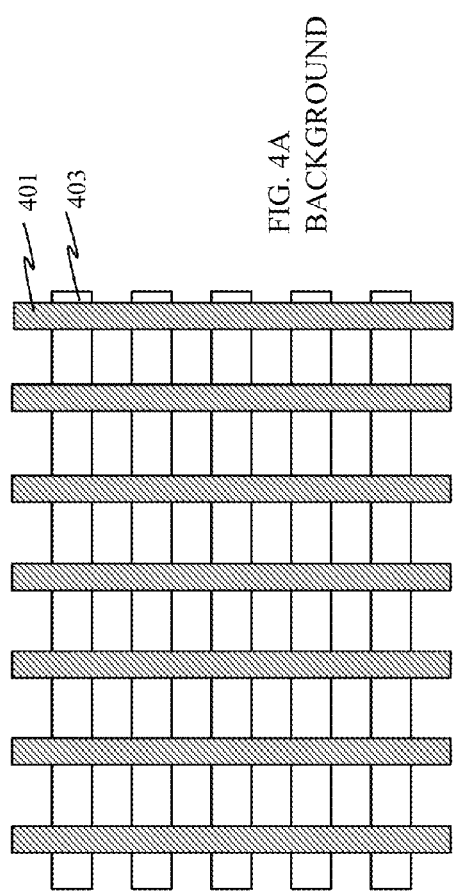
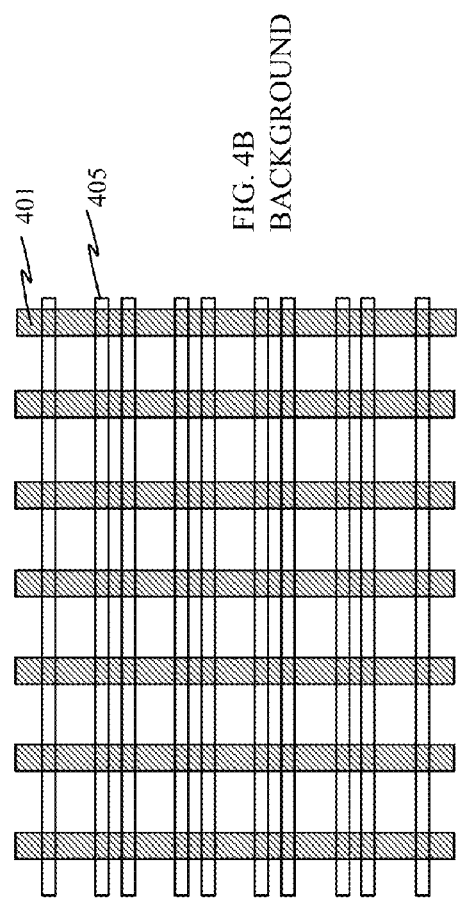
FIG. 4A BACKGROUND
FIG. 4B BACKGROUND

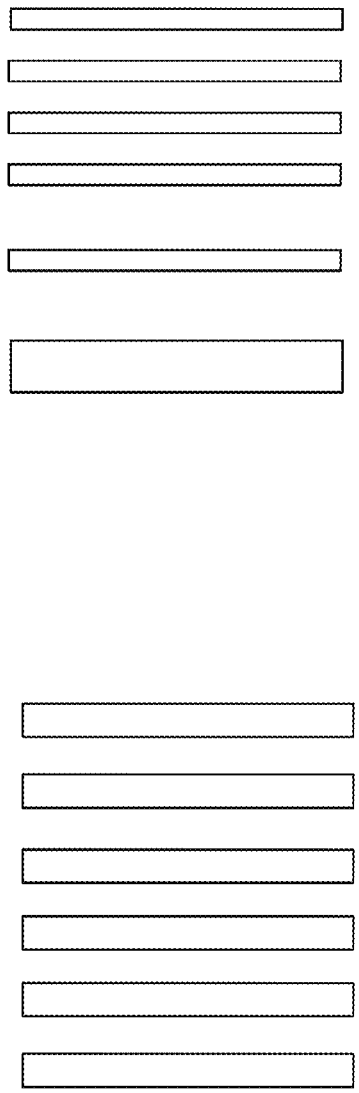
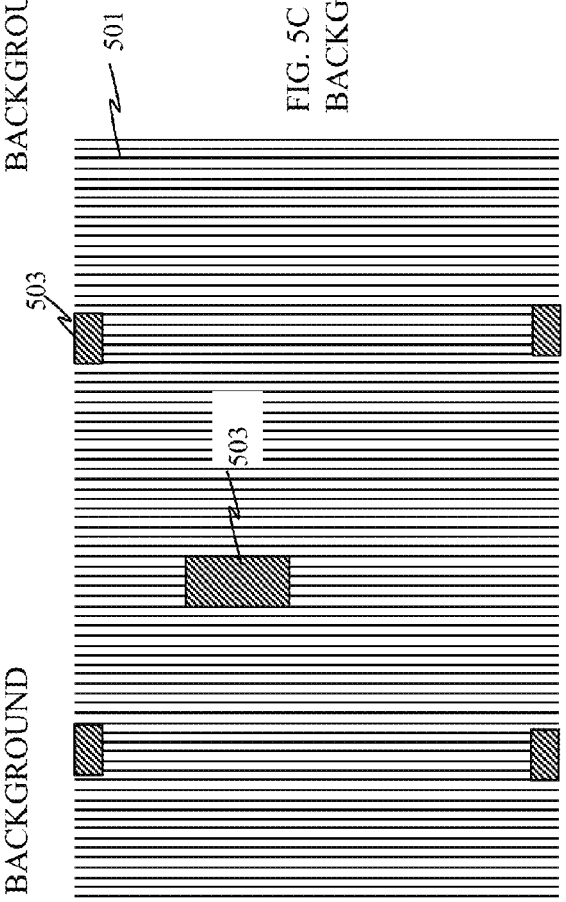
FIG. 5A BACKGROUND
FIG. 5B BACKGROUND
FIG. 5C BACKGROUND

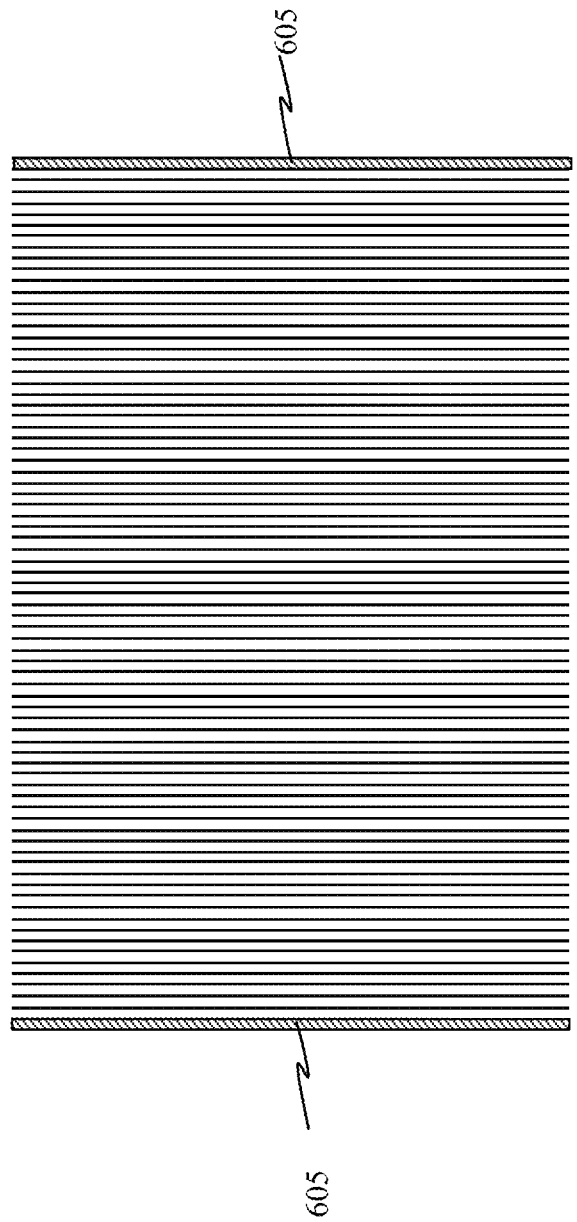

HYBRID METHOD FOR PERFORMING FULL FIELD OPTICAL PROXIMITY CORRECTION FOR FINFET MANDREL LAYER

TECHNICAL FIELD

The present disclosure relates to optical proximity correction (OPC) for semiconductor finfet mandrel layers. The present disclosure is particularly applicable to devices including static random access memory (SRAM) portions for the 22 nanometer (nm) technology node and beyond.

BACKGROUND

To reduce transistor size when SRAM cells or other types of cells are created using conventional planar transistors (see FIGS. 1A through 1C, in which 101 and 103 represent the source and drain, and 105 represents the gate), integrated circuit (IC) manufacturers generally adjust properties by doping more impurities into the device area. However this adjustment creates undesirable variability and deteriorates the circuit stability. This issue is critical at the 22 nm technology node and beyond. The use of finfets (see FIGS. 2A through 2C, in which 201 and 203 represent the source and drain, 205 represents the gate, and 207 represents the fin), vertical transistors with fin-shaped undoped silicon channels, has been proposed as an alternative approach to allow circuit size reduction with less characteristic variation.

To form fins on a substrate, a self-aligned double patterning (SADP) process is employed. For example, a coherent light source 301 is directed through a classical photomask 303 at a resist 305, as illustrated in FIG. 3A, and the resist is etched to form mandrels 307 (FIG. 3B). As shown in FIG. 3C, sidewall spacers 309 are then deposited on the sides of the mandrels 307 with conventional chemical and chemical mechanical polishing (CMP) processes. Finally, the mandrels are removed, for example by etching, leaving the fins on the substrate, as illustrated in FIG. 3D. The fins are placed over large areas, tightly spaced (e.g., having a space of 22 nm between adjacent fins and having a center-to-center pitch of 44 nm) and repetitively formed where transistors are to be fabricated. Once the fins are patterned, gates can be formed over the fin, as illustrated in FIG. 2C.

Adverting to FIGS. 4A and 4B, the gates 401 and either mandrels 403 or fins 405 form a regular layout with fixed spacings. Therefore, either the mandrels can be drawn or the fins can be drawn for the computer-aided design (CAD) layout, and then the actual mask can be generated from either pattern. For logic structures, the layout for mandrels is an ultra regular design, with ultra regular pitches, as illustrated in FIG. 5A. For SRAMs, however, the pitch varies, as shown in FIG. 5B. As illustrated in FIG. 5C, a chip may have ultra regular pattern 501 for the logic portion, which may cover more than 95% of the chip, and varying pitches at 503 for the SRAM portion.

When a pattern is printed on a wafer, the diffraction of light through the mask leads to distorted images on the wafer, for example images with corner rounding, line shortening, or even elimination of image portions. To end with the correct design on the wafer, a resist model or design model is prepared, incorporated into model software, and OPC is employed. OPC may be either rule based or model based. For full model based OPC, a calculation of how the image will look must be performed for every line, which is very time consuming. For a regular pattern, rule based OPC may be employed; once it is known how one portion will behave, the rules for correcting that portion can be applied for each repeat of that portion. Since the finfet mandrel layer for a full chip generally includes both regular and irregular patterns (for example, logic portions and SRAM portions), model based OPC is required.

A need therefore exists for methodology enabling faster OPC for finfet mandrel layers for full chip layouts including irregular patterns.

SUMMARY

An aspect of the present disclosure is a hybrid OPC method including rule based OPC on the entire reticle and model based OPC on a portion having irregular pitches.

Another aspect of the present disclosure is a hybrid OPC method including rule based OPC on a portion having regular pitches and model based OPC on a portion having irregular pitches.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: generating a finfet fin reticle including a first portion having regular pitches and a second portion having irregular pitches; performing rule based OPC on the entire reticle; and performing OPC repair locally at the second portion.

Another aspect of the present disclosure is a method including: generating a finfet fin reticle including a first portion having regular pitches and a second portion having irregular pitches; performing rule based OPC only on the first portion; and performing OPC repair locally at the second portion.

Aspects include performing OPC repair by performing model based OPC. Other aspects include generating the reticle by drawing fins or mandrels and patterning fins based on the drawn mandrels. Further aspects include the second portion including a SRAM region and a region of iso and semi-iso patterns. Additional aspects include creating a first repair OPC region at the SRAM region according to an SRAM maker shape. Another aspect includes creating a second repair OPC region at the region of iso and semi-iso patterns by locating SRAM and logic transition areas, block to block transition areas, and reticle boundaries. Further aspects include combining the first and second repair OPC regions and covering them with a cover layer, prior to performing the rule based OPC. Other aspects include stitching the post OPC repair layout with a full field layout. Additional aspects include performing final verification of the reticle subsequent to stitching the post OPC repair layout with the full field layout.

Another aspect of the present disclosure is a finfet reticle including a first portion having regular pitches and a second portion having irregular pitches, wherein: the first portion includes a logic portion; the second portion includes a SRAM region and a region of iso and semi-iso patterns; rule based OPC is performed at least on the first portion; and model based OPC is performed locally at the second portion. Aspects include the region of iso and semi-iso patterns including SRAM and logic transition areas, block to block transition areas, and reticle boundaries.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1A through 1C schematically illustrate top and cross-sectional views, respectively, of a planar transistor;

FIGS. 2A through 2C schematically illustrate top, cross-sectional, and three dimensional views, respectively, of a vertical transistor, or finfet;

FIGS. 3A through 3D schematically illustrate a process flow for forming finfet fins;

FIGS. 4A and 4B schematically illustrate layouts with mandrels and fins, respectively;

FIGS. 5A through 5C schematically illustrate fin patterns for logic, portions, SRAM portions, a full chip including both logic and SRAM portions, respectively.

FIGS. 6A and 6B schematically illustrate a mandrel reticle with SRAM portions and iso/semi-iso patterns, respectively, to be repaired, in accordance with an exemplary embodiment;

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of time consuming OPC processes attendant upon performing full reticle OPC for a finfet mandrel layer of a chip including both logic and SRAM portions. In accordance with embodiments of the present disclosure, rule based OPC is performed on the entire reticle, and then an OPC repair is performed locally for errors.

Methodology in accordance with embodiments of the present disclosure includes generating a finfet fin reticle including a first portion having regular pitches and a second portion having irregular pitches; performing rule based OPC on the entire reticle; and performing OPC repair locally at the second portion.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 3C:
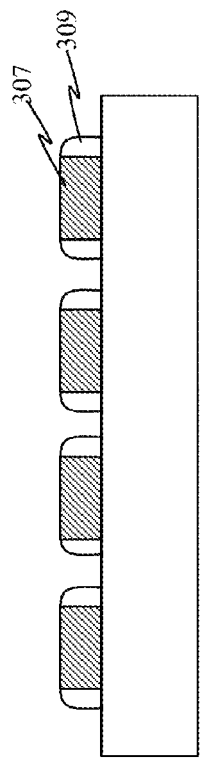
Figure 3D:
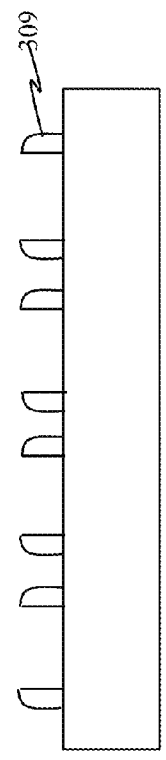
Figure 6A:
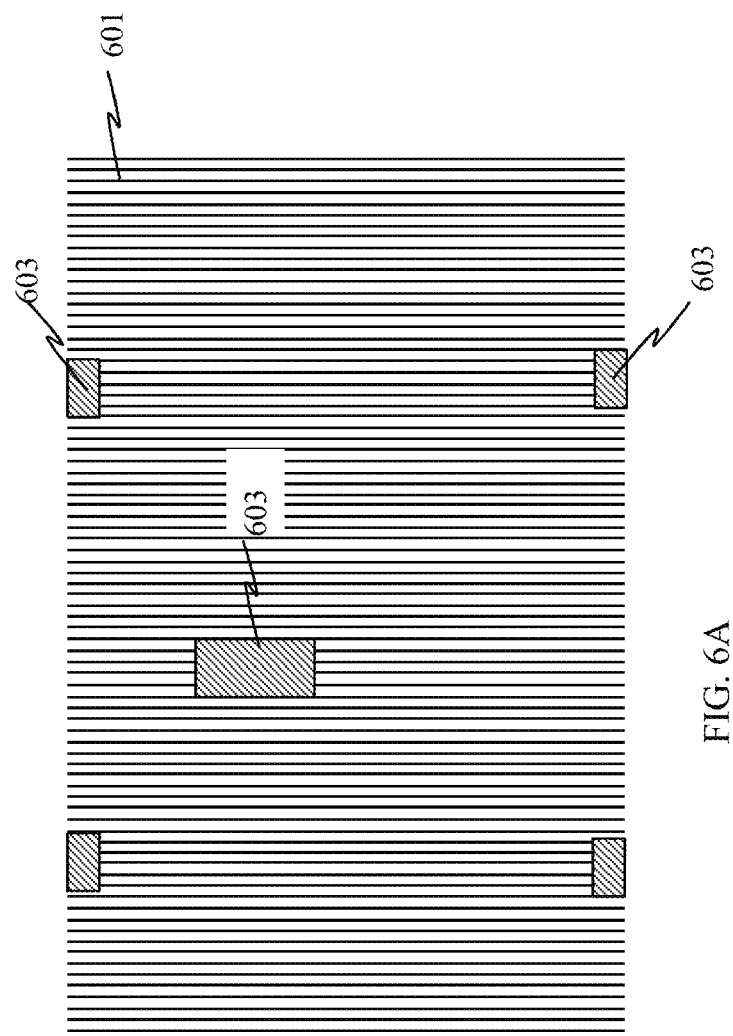
Figure 7:
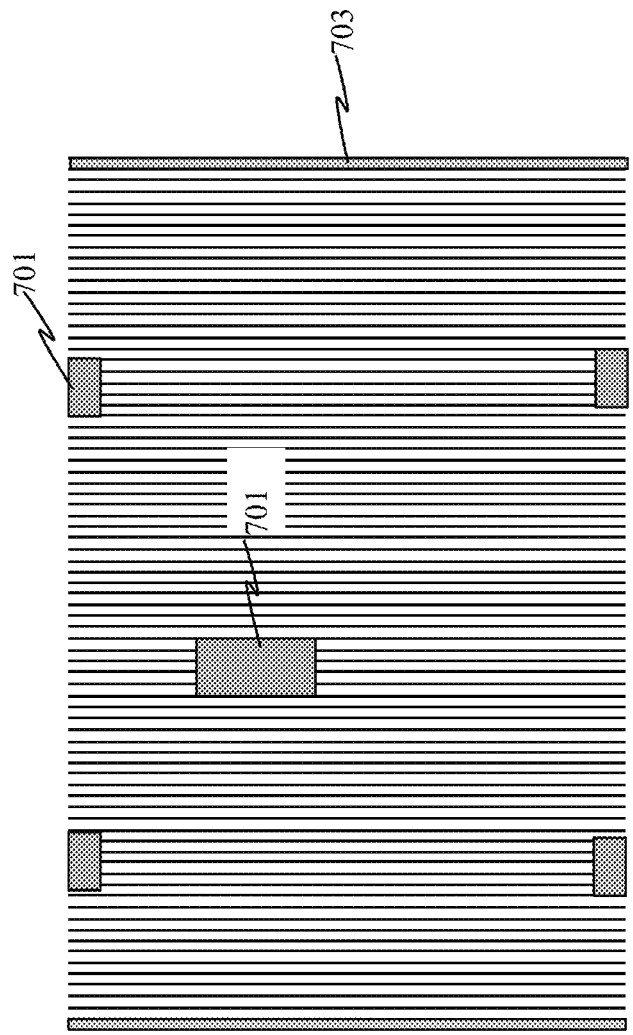
FIG. 7 schematically illustrates the mandrel reticle of FIGS. 6A and 6B with both the SRAM portions and iso/semi-iso patterns to be repaired covered with a cover layer, in accordance with an exemplary embodiment.
Figure 8A:
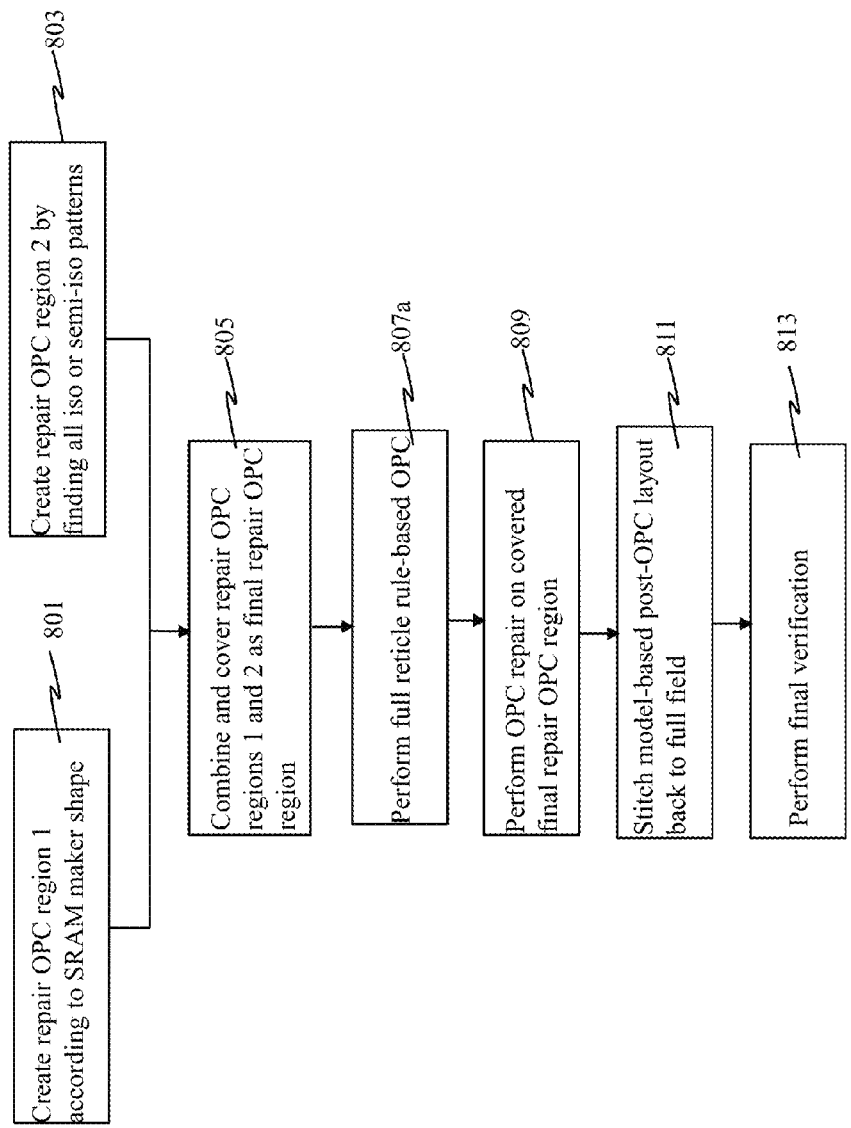
FIGS. 8A and 8B illustrate alternative process flows for a hybrid OPC process, in accordance with an exemplary embodiment.
Figure 8B:
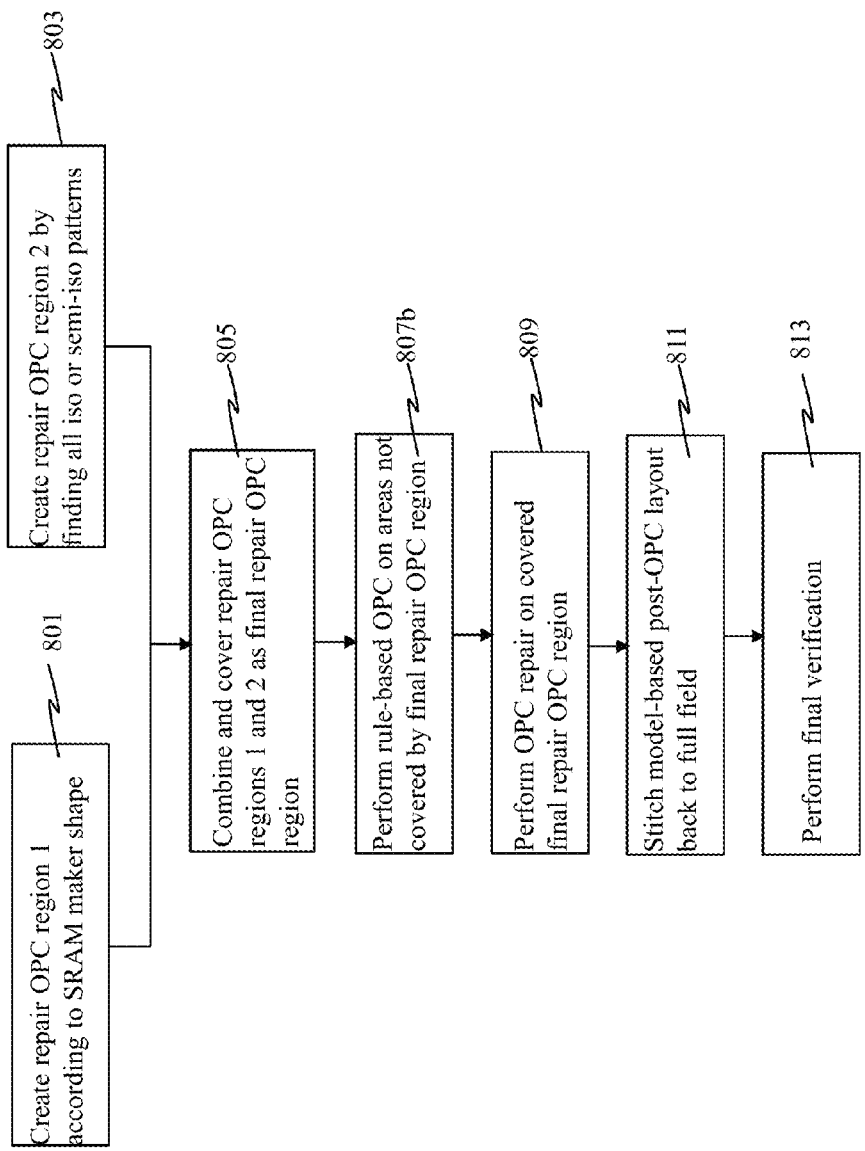

Adverting to FIGS. 6A, 8A, and 8B, SRAM portions 603 of a mandrel reticle having an ultra regular logic design portion 601 are created as repair OPC region 1 according to an SRAM maker shape. The logic design portion 601 will cover at least 95% of the reticle. Repair OPC region 2 is created in step 803 by finding all isolated (iso) or semi-iso patterns, such as SRAM and logic transition areas, block MACRO to block transition areas, and reticle boundaries, 605 in FIG. 6B. In step 805, repair OPC regions 1 and 2 are combined as a final repair OPC region which is covered with a cover layer, as shown in FIG. 7. For example, SRAM portions 701 and reticle boundaries 703 are covered with a cover layer.

A rule based OPC is performed for the entire reticle in step 807a, as shown in FIG. 8A. Then, in step 809, OPC repair is performed on the final repair OPC region by running a model-based OPC only in the locations that are covered with the cover layer. The model-based post-OPC layer must then be stitched back to the full field (step 811). Last, a final verification, including an optical rule check (ORC) and mask rule check (MRC), must be performed at step 813 to verify that no hotspots exist. This hybrid OPC solution using OPC repair techniques speeds up run-time and reduces uncertainties.

Alternatively, as shown in FIG. 8B, rule based OPC is performed in step 807b only in areas not covered by the cover layer. Then, in step 809, OPC repair is performed on the final repair OPC region by running a model-based OPC only in the locations that are covered with the cover layer. The model-based post-OPC layer must then be stitched back to the full field (step 811). Last, a final verification, including an ORC and MRC, must be performed at step 813 to verify that no hotspots exist. This hybrid OPC solution using OPC repair techniques speeds up run-time and reduces uncertainties.

Figure 9B:
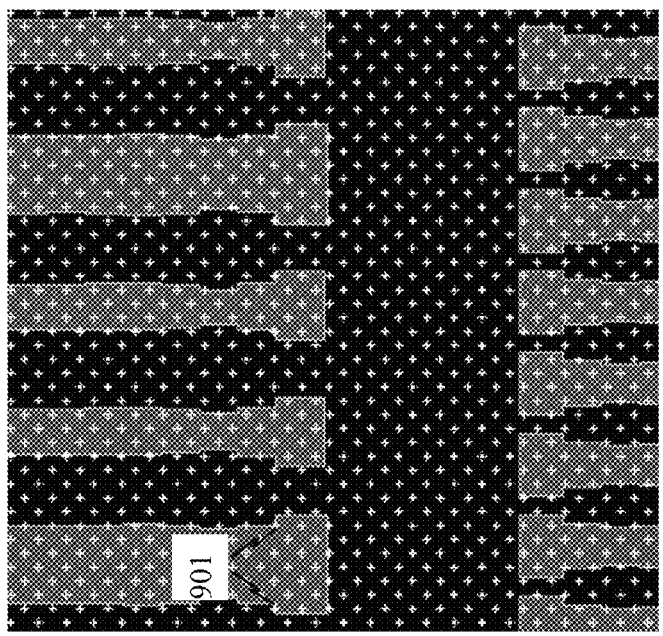
FIGS. 9A and 9B schematically illustrate regions inside repair OPC portions post OPC, in accordance with an exemplary embodiment.
Figure 9A:
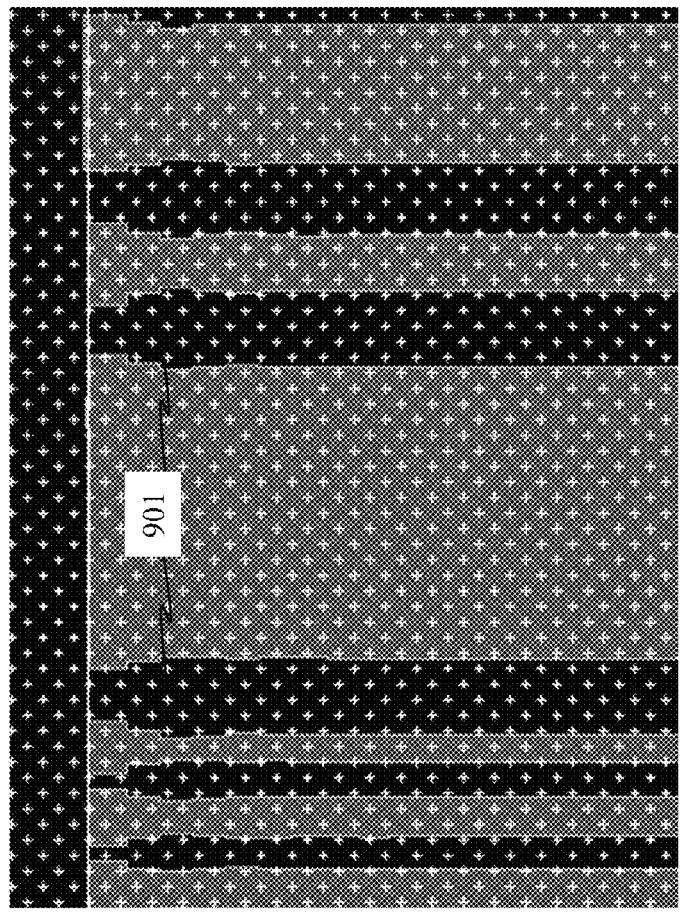
Figure 9C:
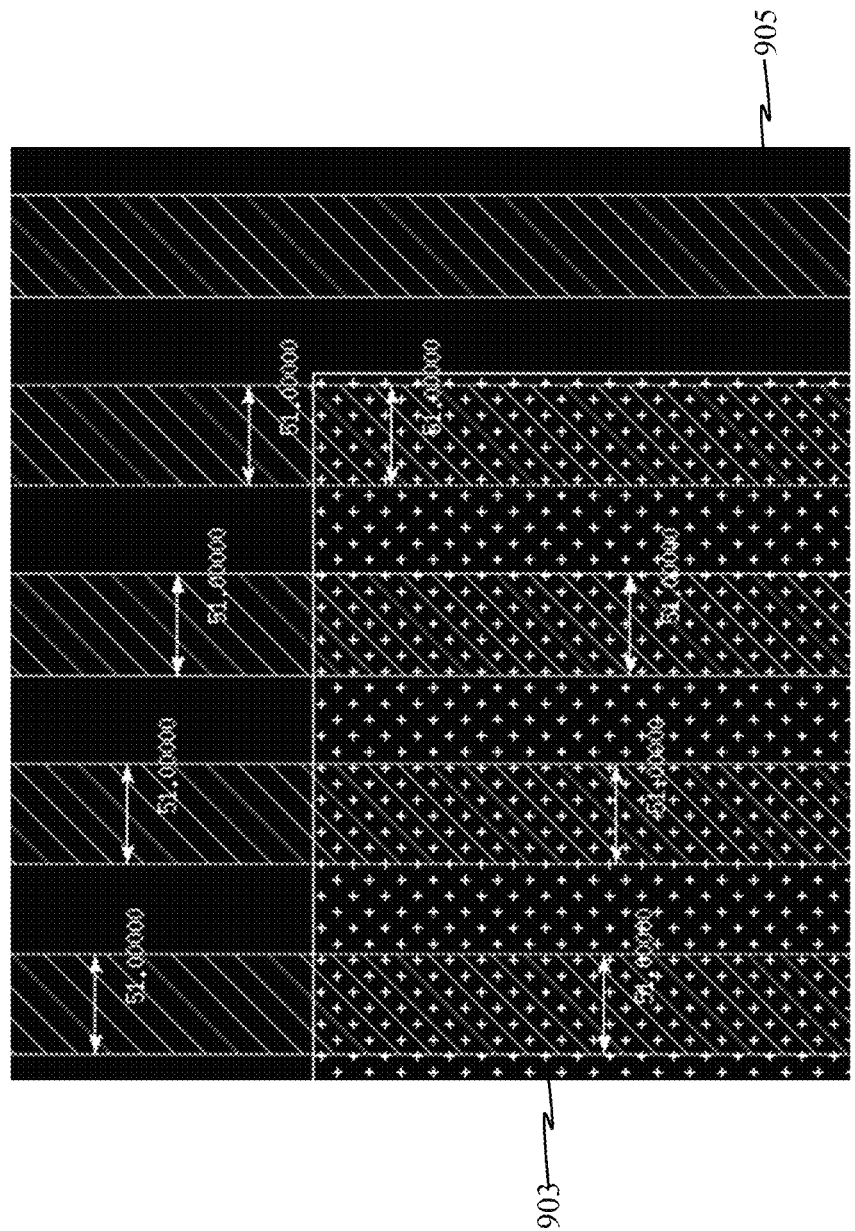
FIG. 9C schematically illustrates a boundary area between a repair OPC region and a rule-based OPC region, in accordance with an exemplary embodiment.

FIGS. 9A and 9B illustrate regions inside repair OPC portions post OPC. For example, FIGS. 9A and 9B show regions inside an SRAM. As illustrated, small jogs 901 are formed at the edges of various elements by the full reticle rule-based OPC. Repair OPC may be employed to avoid the small jogs and smooth the boundaries. FIG. 9C shows a boundary area between repair OPC region 903 and rule-based OPC region 905.

Figure 9E:
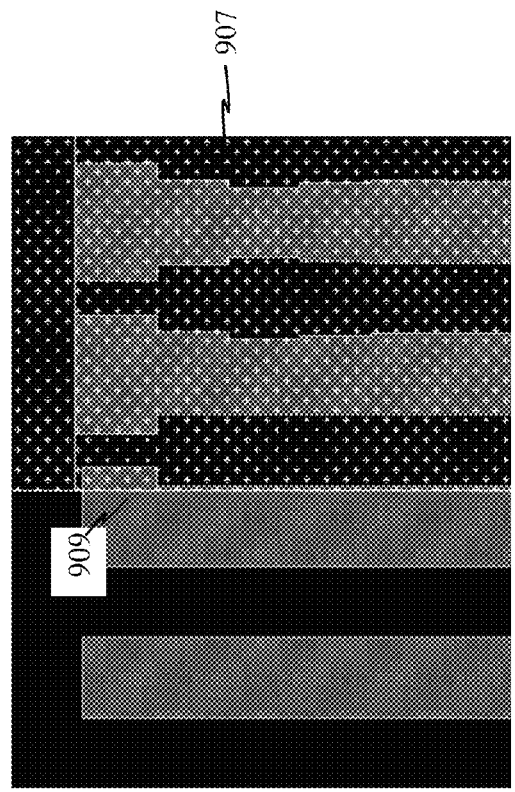
FIGS. 9D and 9E schematically illustrate the re-simulated mask shape outside the repair OPC regions creating violations, in accordance with an exemplary embodiment.
Figure 9D:
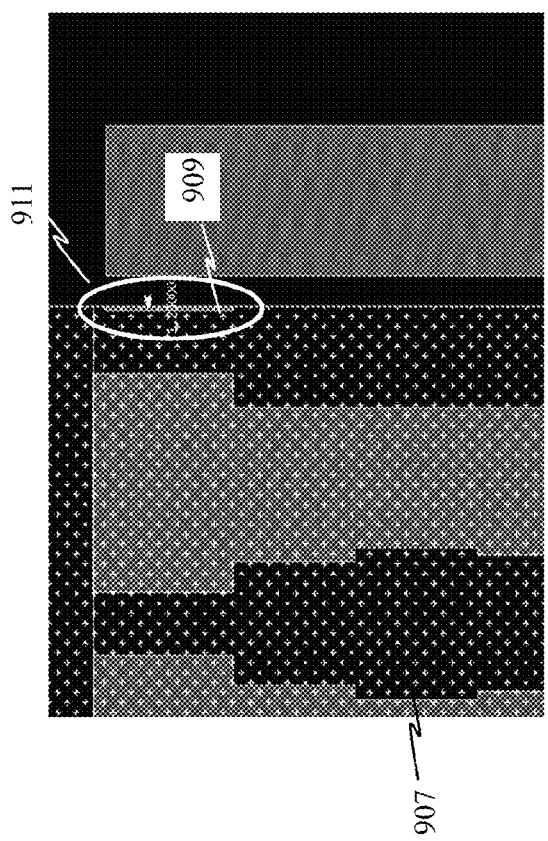

As illustrated in FIGS. 9D and 9E, the mask shape outside the repair OPC regions 907 is re-simulated (for example, at 909 and 911), rather than using the actual mask as a reference, creating violation 913. Sometimes, if rule-based OPC is not applied correctly, small jogs are created because the manufacturer cannot fabricate such small lines. However, a full-reticle model-based OPC would require significant run-time.

An example runtime comparison between full-model based OPC and the hybrid OPC of the present disclosure is illustrated in Table 1 for a 9.2 millimeter (mm) by 12 mm section of a chip.

TABLE 1

| | OPC STEPS | |
|---|---|---|
| | MB-OPC (in hours) | Hybrid-OPC (in hours) |
| Total | 19572 | 4189 |
| Dense OPC | 14831 | 959 |
| OPC verify | 4619 | 3147 |

As shown in Table 1, a full-model based OPC may take 14,831 hours for the dense OPC followed by 4,619 hours for the OPC final verification, for a total of 19,572 hours. In contrast, the hybrid OPC of the present disclosure may take 959 hours for dense OPC, 3,147 hours for OPC final verification, for a total of 4,189 hours. If, for example, there were 100 CPUs, then the total time in real time would be 195.72 hours versus 41.89 hours. The hybrid OPC thus takes approximately a fifth the amount of time. The smaller the SRAM and iso/semi-iso pattern areas, the greater the time savings will be.

The embodiments of the present disclosure can achieve several technical effects such as faster runtime and reduced uncertainties for OPC. The present disclosure enjoys industrial applicability in any of various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices that employ vertical transistors or finfets.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   generating a finfet fin reticle including a first portion having regular pitches and a second portion, comprising a static random access memory (SRAM) region and a region of iso and semi-iso patterns, and having varying pitches;
   performing rule based optical proximity correction (OPC), via at least one processor, on the entire reticle;
   performing OPC repair locally at the second portion;
   creating a first repair OPC region at the SRAM; and
   creating a second repair OPC region at the region of iso and semi-iso patterns by locating SRAM and logic transition areas, block to block transition areas, and reticle boundaries.

2. The method according to claim 1, wherein performing OPC repair comprises performing model based OPC.

3. The method according to claim 1, comprising generating the reticle by drawing fins or mandrels and patterning fins based on the drawn mandrels.

4. The method according to claim 1, further comprising combining the first and second repair OPC regions and covering them with a cover layer, prior to performing the rule based OPC.

5. The method according to claim 4, further comprising stitching the post OPC repair layout with a full field layout.

6. The method according to claim 5, further comprising performing final verification of the reticle subsequent to stitching the post OPC repair layout with the full field layout.

7. A method comprising:
   generating a finfet fin reticle including a first portion having regular pitches and a second portion, comprising a static random access memory (SRAM) region and a region of iso and semi-iso patterns, and having varying pitches;
   performing rule based optical proximity correction (OPC), via at least one processor, only on the first portion;
   performing OPC repair locally at the second portion;
   creating a first repair OPC region at the SRAM region; and
   creating a second repair OPC region at the region of iso and semi-iso patterns by locating SRAM and logic transition areas, block to block transition areas, and reticle boundaries.

8. The method according to claim 7, wherein performing OPC repair comprises performing model based OPC.

9. The method according to claim 7, comprising generating the reticle by drawing fins or mandrels and patterning fins based on the drawn mandrels.

10. The method according to claim 7, further comprising combining the first and second repair OPC regions and covering them with a cover layer, prior to performing the rule based OPC.

11. The method according to claim 10, further comprising stitching the post OPC repair layout with a full field layout.

12. The method according to claim 11, further comprising performing final verification of the reticle subsequent to stitching the post OPC repair layout with the full field layout.

13. A finfet reticle comprising a first portion having regular pitches and a second portion having varying pitches, wherein:
   the first portion comprises a logic portion;
   the second portion comprises a static random access memory (SRAM) region and a region of iso and semi-iso patterns, the region of iso and semi-iso patterns comprising SRAM and logic transition areas, block to block transition areas, and reticle boundaries;
   rule based optical proximity correction (OPC) is performed at least on the first portion; and
   model based OPC is performed locally at the second portion;
   a first repair OPC region is created at the SRAM region; and
   a second repair OPC region is created at the region of iso and semi-iso patterns and;
   creating a second repair OPC region at the region of iso and semi-iso patterns by locating SRAM and logic transition areas, block to block transition areas, and reticle boundaries.

* * * * *